United States Patent
Ookawa et al.

(10) Patent No.: US 11,079,451 B2
(45) Date of Patent: Aug. 3, 2021

(54) MRI APPARATUS

(71) Applicant: CANON MEDICAL SYSTEMS CORPORATION, Otawara (JP)

(72) Inventors: Masashi Ookawa, Nasushiobara (JP); Kazuyuki Soejima, Otawara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 52 days.

(21) Appl. No.: 16/031,383

(22) Filed: Jul. 10, 2018

(65) Prior Publication Data

US 2019/0018092 A1 Jan. 17, 2019

(30) Foreign Application Priority Data

Jul. 12, 2017 (JP) .............................. JP2017-136445

(51) Int. Cl.
*G01R 33/36* (2006.01)
*G01R 33/3875* (2006.01)
(Continued)

(52) U.S. Cl.
CPC ........... *G01R 33/385* (2013.01); *G01R 33/36* (2013.01); *G01R 33/3875* (2013.01); *G01R 33/4818* (2013.01); *G01R 33/561* (2013.01); *G01R 33/56518* (2013.01); *G01R 33/56572* (2013.01); *G01R 33/3621* (2013.01)

(58) Field of Classification Search
CPC .... G01R 33/36; G01R 19/0092; G01R 33/58; G01R 33/5676; H02M 3/158; H02M 2001/0009; A61N 1/36082; A61N 2005/1055; A61N 2005/1061;
(Continued)

(56) References Cited

U.S. PATENT DOCUMENTS 4,389,727 A * 6/1983 Rouffet ................. H04L 7/0272
327/553
2016/0245891 A1* 8/2016 Ookawa ........... G01R 33/56518

FOREIGN PATENT DOCUMENTS

JP 2001-078987 A 3/2001
JP 2001-104284 A 4/2001
JP 2003-061927 3/2003

OTHER PUBLICATIONS

Japanese Office Action dated May 25, 2021, issued in Japanese Patent Application No. 2017-136445.

* cited by examiner

*Primary Examiner* — Melissa J Koval
*Assistant Examiner* — Trung Q Nguyen
(74) *Attorney, Agent, or Firm* — Oblon, McClelland, Maier & Neustadt, L.L.P.

(57) ABSTRACT

In one embodiment, an MRI apparatus includes a gradient coil, a receiving circuit, and processing circuitry. The gradient coil is configured to superimpose a gradient magnetic field on a static magnetic field. The receiving circuit is configured to receive an MR (magnetic resonance) signal from an object placed in the gradient magnetic field. The processing circuitry is configured to estimate time variation of an MR (magnetic resonance) frequency during a sampling period of the MR signal based on waveform data of a gradient current applied to the gradient coil, perform correction on a frequency or phase of the MR signal received by the receiving circuit based on the estimated time variation of the MR frequency during the sampling period, and reconstruct an image by using the MR signal subjected to the correction.

9 Claims, 11 Drawing Sheets

(51) Int. Cl.
*G01R 33/385* (2006.01)
*G01R 33/561* (2006.01)
*G01R 33/48* (2006.01)
*G01R 33/565* (2006.01)

(58) Field of Classification Search
CPC .... G01N 24/08; G01N 33/48; G01N 2800/32; H04L 2012/40273; A61B 5/4504; A61B 5/0044
USPC .......... 324/300, 309, 314, 318, 322; 382/128–131; 600/407–445
See application file for complete search history.

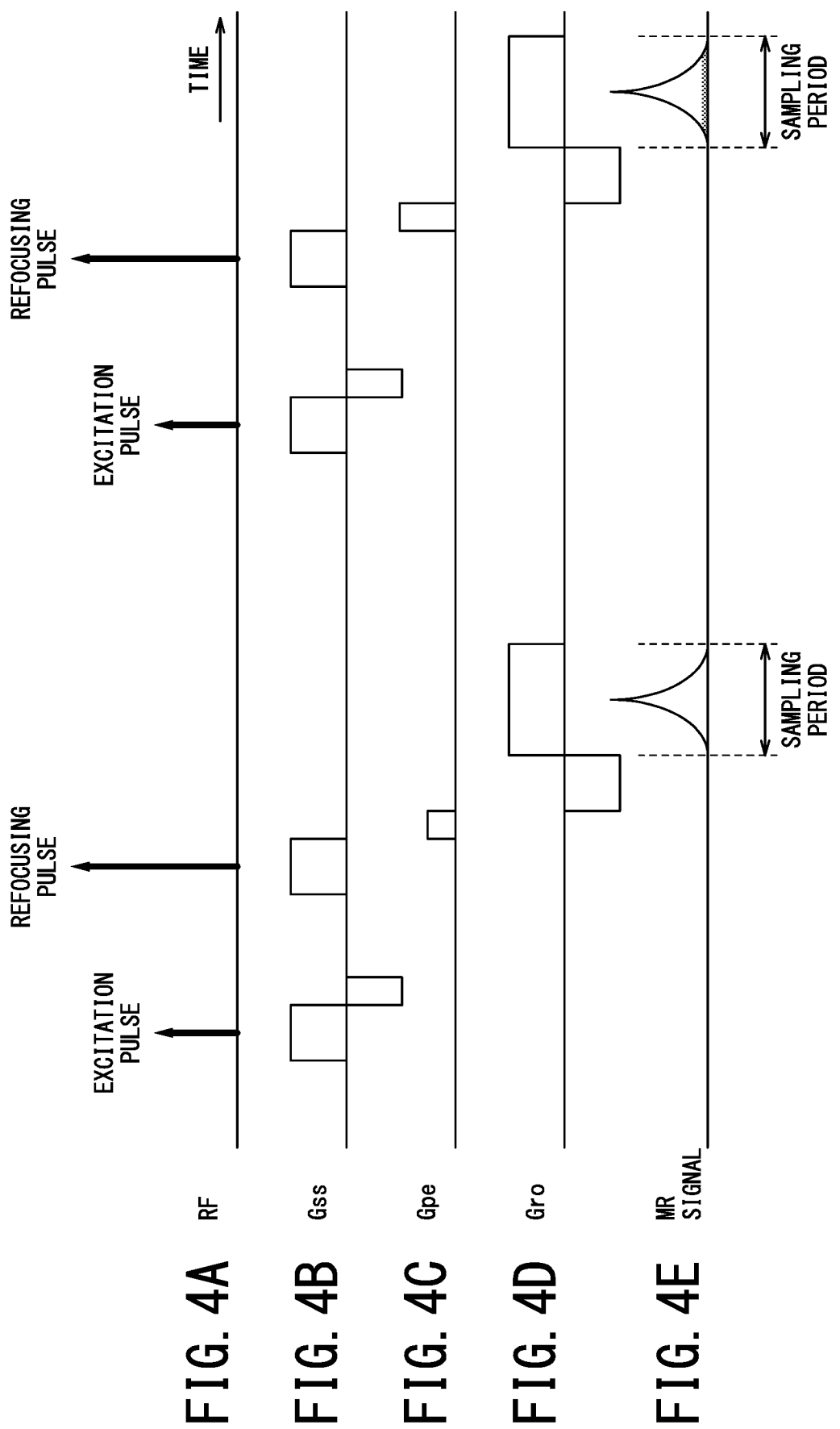

FIG. 5A  Gss
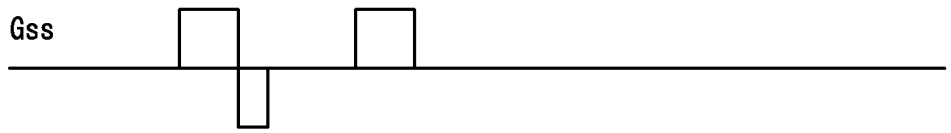
FIG. 5B  ZERO-ORDER EDDY-CURRENT MAGNETIC FIELD ΔBss
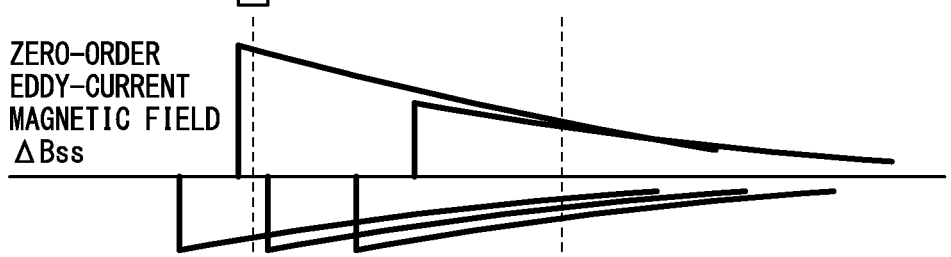
FIG. 5C  Gpe
FIG. 5D  ZERO-ORDER EDDY-CURRENT MAGNETIC FIELD ΔBpe
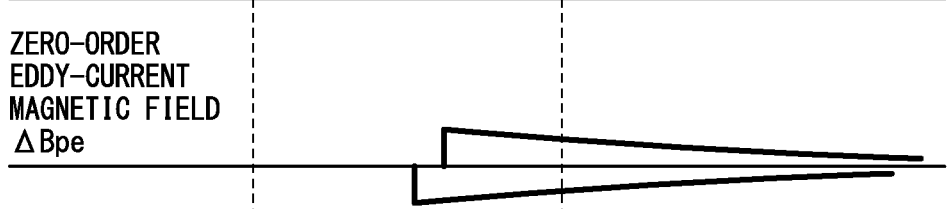
FIG. 5E  Gro
FIG. 5F  ZERO-ORDER EDDY-CURRENT MAGNETIC FIELD ΔBro
FIG. 5G  ZERO-ORDER EDDY-CURRENT MAGNETIC FIELD (AFTER SUMMATION) ΔB(t)
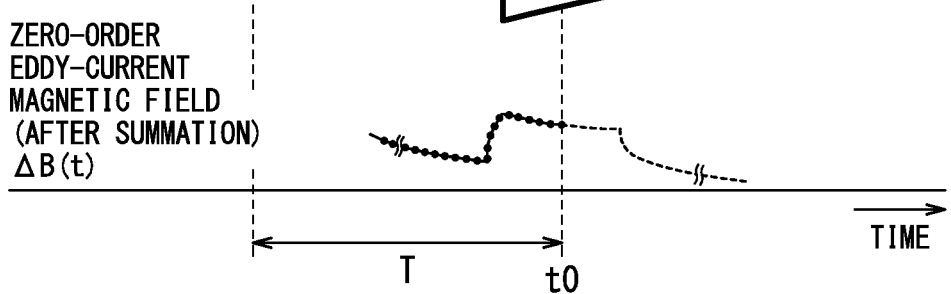
T   t0   TIME

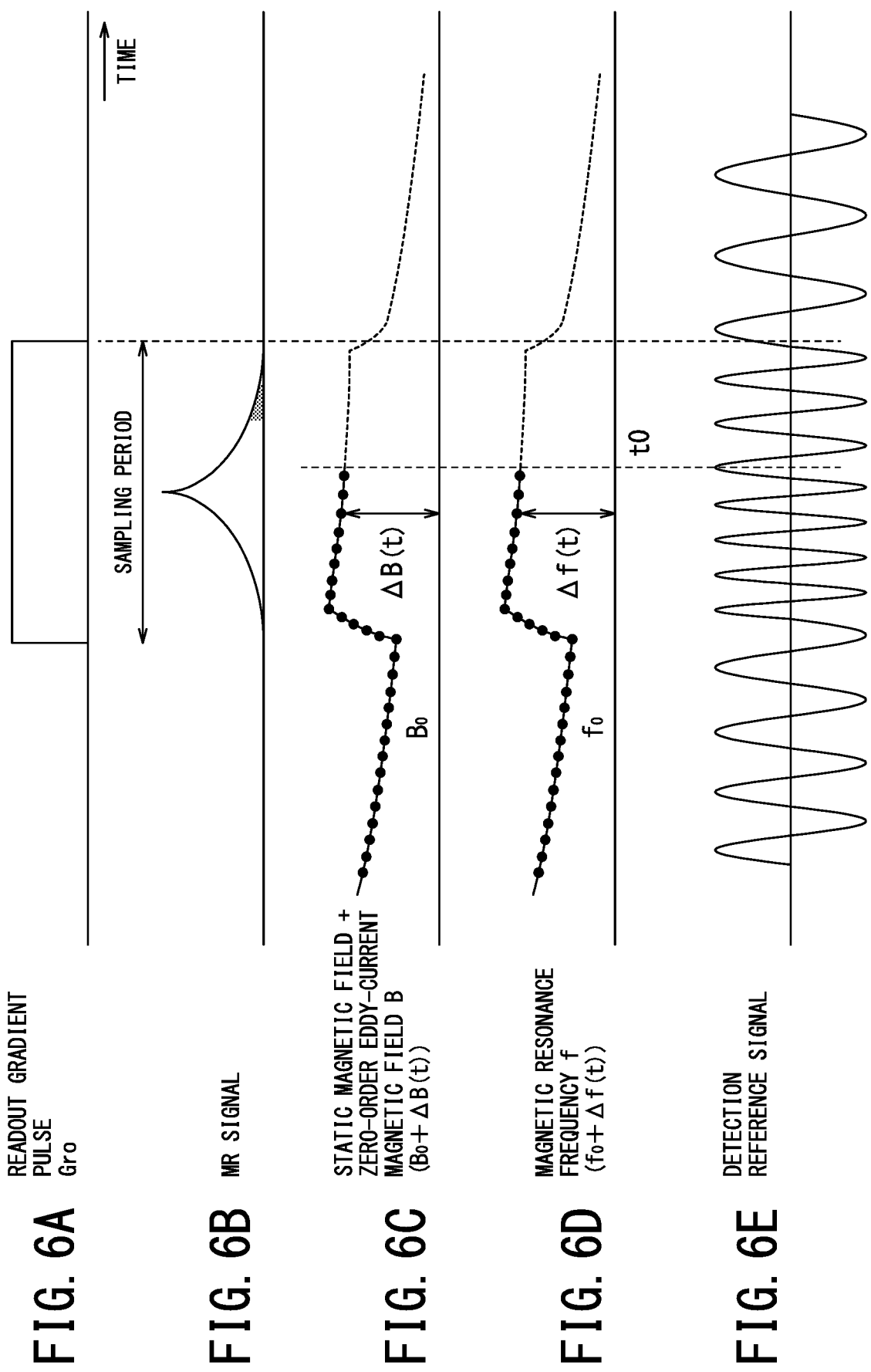

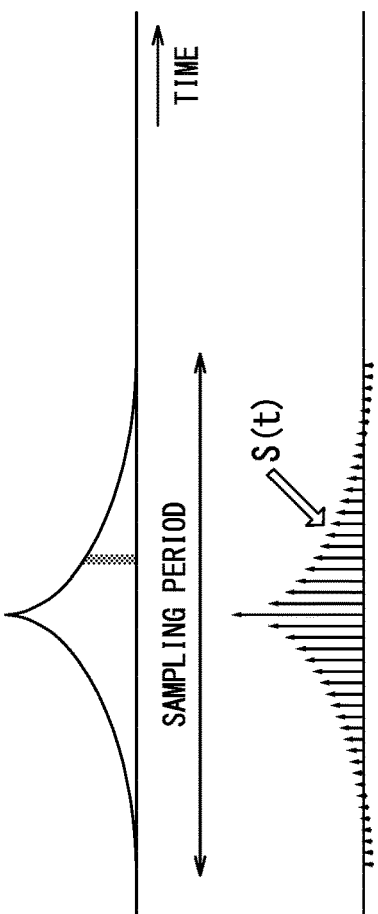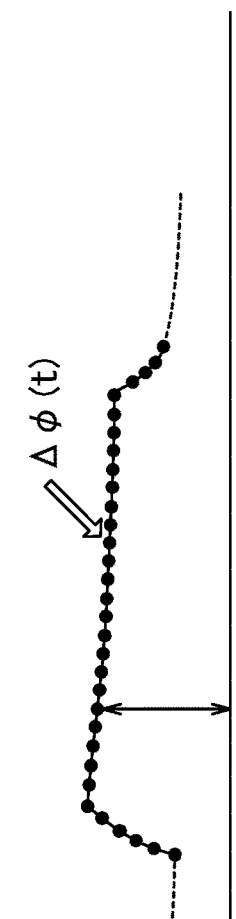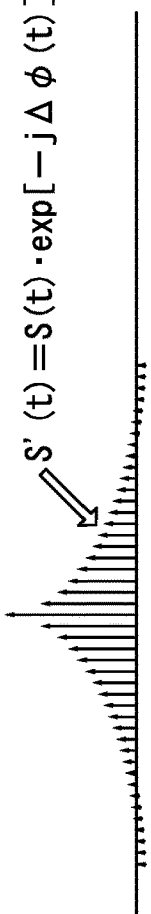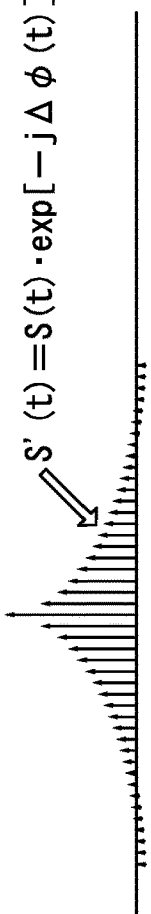

MRI APPARATUS

CROSS-REFERENCE TO RELATED APPLICATION

This application is based upon and claims the benefit of priority from Japanese Patent Application No. 2017-136445, filed on Jul. 12, 2017, the entire contents of which are incorporated herein by reference.

FIELD

Embodiments described herein relate generally to a magnetic resonance imaging (MRI) apparatus.

BACKGROUND

An MRI apparatus is an imaging apparatus that magnetically excites nuclear spin of an object placed in a static magnetic field by applying a radio frequency (RF) pulse having the Larmor frequency and reconstructs an image on the basis of magnetic resonance (MR) signal emitted from the object due to the excitation.

Disturbance of the magnetic field due to an eddy current is known as one of factors of deterioration in image quality of magnetic resonance images. When a pulse current is applied to the gradient coil, an eddy current flows through metal, e.g., a heat shield plate of the static magnetic field coil, in the vicinity of the gradient coil, due to the leakage magnetic field of the gradient magnetic field. An eddy current magnetic field is generated by this eddy current.

The static magnetic field or the gradient magnetic field is disturbed by the eddy current magnetic field, which causes deterioration of image quality. In particular, it is known that variation of the zero-order component of the magnetic field due to the eddy current magnetic field causes variation of the magnetic resonance frequency.

BRIEF DESCRIPTION OF THE DRAWINGS

In the accompanying drawings:

FIGS. 4A to 4E are schematic timing charts illustrating a pulse sequence to be set by an imaging-condition setting function;

FIGS. 5A to 5G are schematic timing charts illustrating a processing concept of estimating time variation of an eddy current magnetic field from a waveform of a gradient current;

FIGS. 6A to 6E are schematic timing charts illustrating a processing concept of estimating time variation of a magnetic resonance frequency and setting a frequency correction amount for DDS;

FIGS. 10A to 10D are schematic timing charts illustrating a processing concept of correcting phase variation due to a zero-order component of an eddy current magnetic field by software processing.

DETAILED DESCRIPTION

Hereinafter, respective embodiments of MRI apparatuses will be described with reference to the accompanying drawings. In the following embodiments, components assigned with the same reference sign are assumed to function and operate in the same manner, and duplicate description is omitted.

In one embodiment, an MRI apparatus includes a gradient coil, a receiving circuit, and processing circuitry. The gradient coil is configured to superimpose a gradient magnetic field on a static magnetic field. The receiving circuit is configured to receive an MR (magnetic resonance) signal from an object placed in the gradient magnetic field. The processing circuitry is configured to estimate time variation of an MR (magnetic resonance) frequency during a sampling period of the MR signal based on waveform data of a gradient current applied to the gradient coil, perform correction on a frequency or phase of the MR signal received by the receiving circuit based on the estimated time variation of the MR frequency during the sampling period, and reconstruct an image by using the MR signal subjected to the correction.

Figure 1:
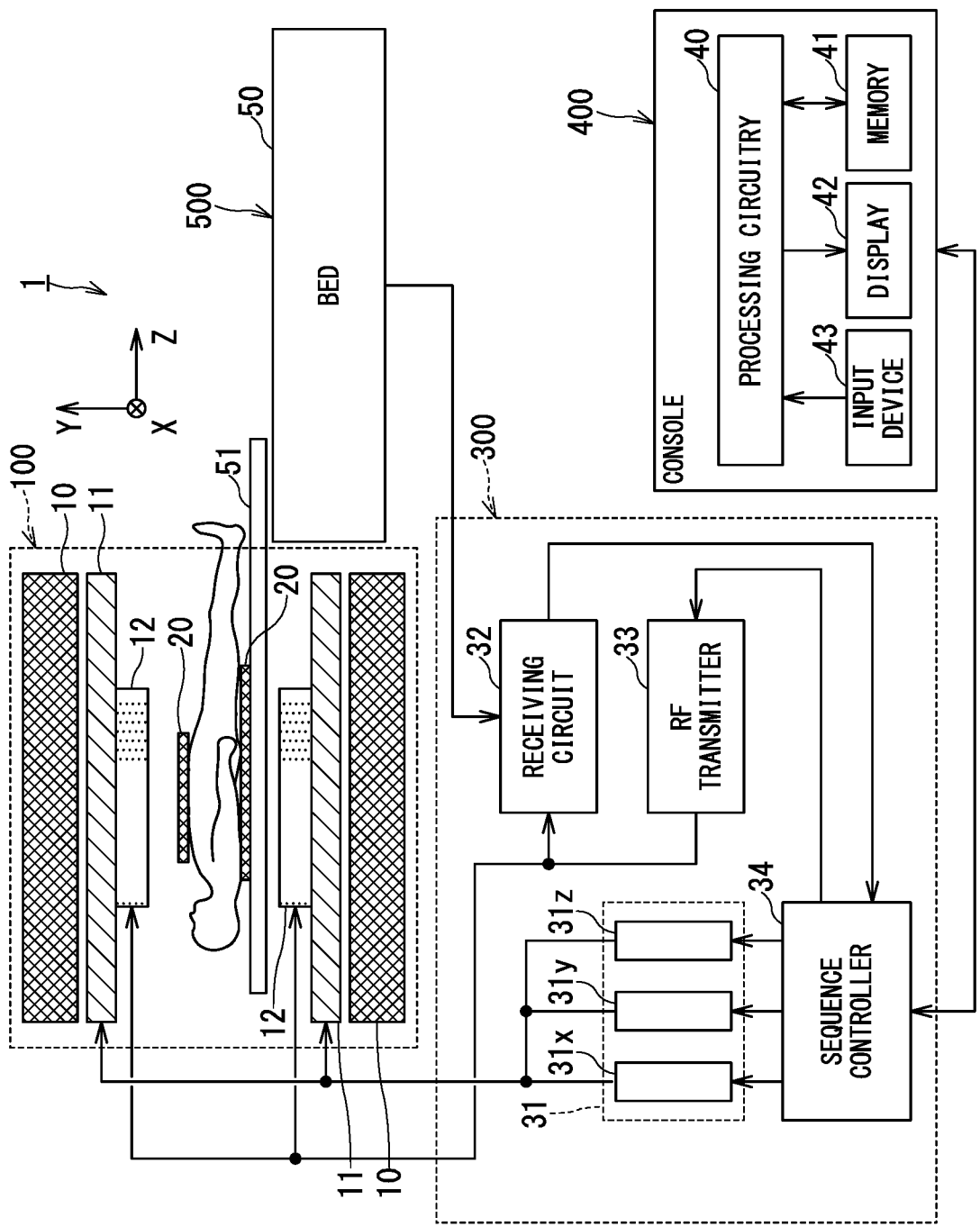
FIG. 1 is a block diagram illustrating overall configuration of an MRI apparatus of one embodiment.

FIG. 1 is a block diagram illustrating overall configuration of an MRI apparatus 1 according to the present embodiment. The MRI apparatus 1 includes a gantry 100, a control cabinet 300, a console 400, a bed 500, and one or more Radio Frequency (RF) coil(s) 20.

The gantry 100 includes a static magnetic field magnet 10, a gradient coil 11, and a whole body (WB) coil 12, and these components are housed in a cylindrical housing. The bed 500 includes a bed body 50 and a table 51.

The control cabinet 300 includes three gradient coil power supplies 31 (31*x* for an X-axis, 31*y* for a Y-axis, and 31*z* for a Z-axis), a receiving circuit 32, an RF transmitter 33, and a sequence controller 34.

The console 400 includes processing circuitry 40, a memory 41, a display 42, and an input device 43. The console 400 functions as a host computer.

The static magnetic field magnet 10 of the gantry 100 is substantially in the form of a cylinder, and generates a static magnetic field inside a bore into which an object, e.g., a patient is transported. The bore is a space inside the cylindrical structure of the gantry 100. The static magnetic field magnet 10 includes a superconducting coil inside, and the superconducting coil is cooled down to an extremely low temperature by liquid helium. The static magnetic field magnet 10 generates a static magnetic field by supplying the superconducting coil with an electric current provided from a non-illustrated static magnetic field power supply in an excitation mode. Afterward, the static magnetic field magnet 10 shifts to a permanent current mode, and the static magnetic field supply is separated. Once it enters the permanent current mode, the static magnetic field magnet 10 continues to generate a strong static magnetic field for a long time, e.g., over one year.

The static magnetic field magnet 10 houses the liquid helium and the superconducting coil by a cylindrical heat shield plate made of an alloy such as aluminum in order to maintain an extremely low temperature state.

The gradient coil 11 is also substantially in the form of a cylinder and is fixed to the inside of the static magnetic field magnet 10. This gradient coil 11 applies gradient magnetic fields (e.g., gradient pulses) to an object in the respective directions of the X-axis, the Y-axis, and the Z-axis, by using electric currents supplied from the gradient coil power supplies $31x$, $31y$, and $31z$.

The bed body 50 of the bed 500 can move the table 51 in the vertical direction and in the horizontal direction. The bed body 50 moves the table 51 with an object loaded thereon to a predetermined height before imaging. Afterward, when the object is imaged, the bed body 50 moves the table 51 in the horizontal direction so as to move the object to inside of the bore.

The WB body coil 12 is shaped substantially in the form of a cylinder so as to surround the object, and is fixed to the inside of the gradient coil 11. The WB coil 12 applies RF pulses transmitted from the RF transmitter 33 to the object. Further, the WB coil 12 receives a magnetic resonance signal, i.e., an MR signal emitted from the object due to excitation of hydrogen nuclei.

The MRI apparatus 1 includes the RF coil(s) 20 as shown in FIG. 1 in addition to the WB coil 12. Each of the RF coil(s) 20 is a coil placed close to the body surface of the object. There are various types for the RF coil(s) 20. For instance, as the types of the RF coil(s) 20, as shown in FIG. 1, there are a body coil attached to the chest, abdomen, or legs of the object and a spine coil attached to the back side of the object. Although most of the RF coil(s) 20 are coils dedicated for reception, some of the RF coil(s) 20 are a type that performs both transmission and reception. The RF coil(s) 20 are configured to be attachable to and detachable from the table 51 via a cable.

The RF transmitter 33 generates an RF pulse on the basis of an instruction from the sequence controller 34. The generated RF pulse is transmitted to the WB coil 12 and applied to the object. An MR signal is generated from the object by the application of the RF pulse. This MR signal is received by the RF coil 20 or the WB coil 11.

The MR signal received by the RF coil 20, more specifically, the MR signal received by each of the coil elements in the RF coil(s) 20, is inputted to the receiving circuit 32 via cables provided on the table 51 and the bed body 50.

The receiving circuit 32 converts the MR signal (analog) into the MR signal (digital) by performing analog to digital (A/D) conversion. Further, the receiving circuit 32 detects the MR signal, i.e., converts the MR signal in an RF (Radio Frequency) signal form into the MR signal in a baseband complex signal form. The MR signal as the baseband complex signal may be referred to as raw data or k-space data in some cases.

The sequence controller 34 performs a scan of the object by driving the gradient coil power supplies 31, the RF transmitter 33, and the receiving circuit 32 under the control of the console 400. When the sequence controller 34 receives raw data from the receiving circuit 32 by performing a scan, the sequence controller 34 transmits the received raw data to the console 400.

The sequence controller 34 includes non-illustrated processing circuitry. This processing circuitry is configured as, e.g., a processor for executing predetermined programs or configured as hardware such as a field programmable gate array (FPGA) or an application specific integrated circuit (ASIC).

The console 400 includes a memory 41, a display 42, an input device 43, and processing circuitry 40.

The memory 41 is a recording medium including a read-only memory (ROM) and a random access memory (RAM) in addition to an external memory device such as a hard disk drive (HDD) and an optical disc device. The memory 41 stores various programs executed by a processor of the processing circuitry 40 as well as various types of data and information.

The display 42 is a display device such as a liquid crystal display panel, a plasma display panel, and an organic EL panel.

The input device 43 includes various devices for an operator to input various types of information and data, and is configured of, e.g., a mouse, a keyboard, a trackball, and/or a touch panel.

The processing circuitry 40 is, e.g., a circuit equipped with a central processing unit (CPU) and/or a special-purpose or general-purpose processor. The processor implements various functions described below by executing the programs stored in the memory 41. The processing circuitry 40 may be configured as hardware such as an FPGA and an ASIC. The various functions described below can also be implemented by such hardware. Additionally, the processing circuitry 40 can implement the various functions by combining hardware processing and software processing based on its processor and programs.

Incidentally, it is well known that an eddy current magnetic field is generated when a gradient pulse is applied to the gradient coil 11 of the MRI apparatus 1. When a gradient pulse is applied to the cylindrical gradient coil 11, gradient magnetic fields are generated not only inside the gradient coil 11 but also outside the gradient coil 11. The magnetic field generated outside the gradient coil 11 is called a leakage magnetic field. When this leakage magnetic field interlinks with the heat shield plate of the static magnetic field magnet 10, an eddy current flows through the heat shield plate because the heat shield plate is a conductor.

An eddy current generates an eddy current magnetic field. The generated eddy current magnetic field is superimposed on the gradient magnetic field and the static magnetic field, which disturbs the originally assumed magnetic field environment and thus the image quality is deteriorated. Hence, in order to suppress the generation of the eddy current, an active shielded gradient coil (ASGC) equipped with a coil outside the gradient coil 11 for canceling the leakage magnetic field is used. The gradient coil 11 shown in FIG. 1 may also be configured as the active shielded gradient coil 11.

Although the eddy current is suppressed by the active shielded gradient coil 11, it is actually difficult to make the eddy current completely zero. Thus, it is also actually difficult to make the eddy current magnetic field completely zero, and it is important to suppress the influence of this eddy current magnetic field.

It can be considered that the eddy current magnetic field is divided into a magnetic field component independent of the spatial position and a magnetic field component depending on the spatial position. The component of the eddy current magnetic field independent of the spatial position is referred to as the zero-order component of the eddy current magnetic field (or simply referred to as the zero-order eddy magnetic field). The component of the eddy current magnetic field changing as a function of first order or higher order than first order with respect to the spatial position is hereinafter referred to as the first-or-higher order component of the eddy current magnetic field.

The first-or-higher order component of the eddy current magnetic field causes variation in the magnitude of the gradient magnetic field. When the magnitude of the gradient magnetic field varies or fluctuates, problems such as an error in the pixel position are caused. In order to correct the first-or-higher order component of the eddy current magnetic field, a method of correcting the waveform shape of the gradient pulse is known.

Meanwhile, the zero-order component of the eddy current magnetic field can be regarded as an offset amount with respect to the static magnetic field intensity, and may become a cause of variation or fluctuation of the magnetic resonance frequency (i.e., the Larmor frequency). Although the zero-order component of the eddy current magnetic field shows the same value spatially, it varies with time. For instance, the zero-order component of the eddy current magnetic field temporally varies even during an application period of one readout gradient pulse, i.e., during a sampling period of one MR signal. As a result, due to the eddy magnetic field, the magnetic resonance frequency $f_0$ varies during the sampling of one MR signal.

The MRI apparatus 1 of the present embodiment provides a method of suppressing the time variation of the zero-order component of the eddy current magnetic field. In addition, as a method of suppressing the time variation of the zero-order component of the eddy current magnetic field, the MRI apparatus 1 according to the first embodiment provides a hardware approach, whereas the MRI apparatus 1 according to the second embodiment provides a software approach. Firstly, the MRI apparatus 1 according to the first embodiment will be described.

First Embodiment

Figure 2:
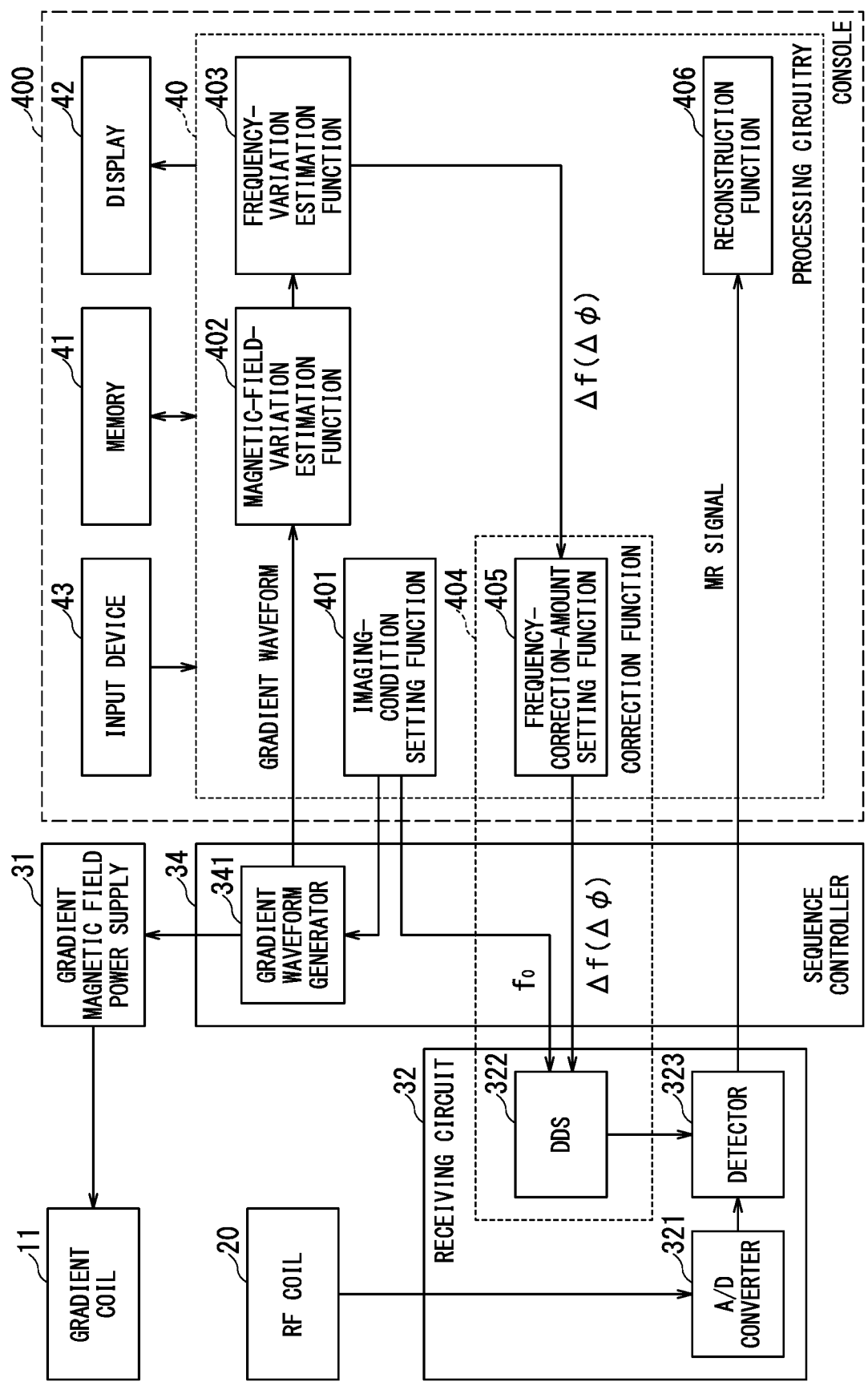
FIG. 2 is a functional block diagram of the MRI apparatus according to the first embodiment.

FIG. 2 is a functional block diagram of the MRI apparatus 1 according to the first embodiment, focusing on the function of suppressing the influence of the eddy current.

As shown in FIG. 2, the processing circuitry 40 of the console 400 implements each of an imaging-condition setting function 401, a magnetic-field-variation estimation function 402, a frequency-variation estimation function 403, a frequency-correction-amount setting function 405 as one of a correction function 404, and a reconstruction function 406. The processing circuitry 40 implements each of these functions by, e.g., causing the processor included in the processing circuitry 40 to execute predetermined programs stored in the memory 41.

The receiving circuit 32 includes an A/D converter 321, a DDS (Direct Digital Synthesizer) 322, and a detector 323 as its internal configuration. Further, the sequence controller 34 includes a gradient waveform generator 341 as its internal configuration.

The imaging-condition setting function 401 sets the imaging conditions, which is selected by a user via the input device 43 or inputted by the user, to the sequence controller 34, and also sets those imaging conditions to the receiving circuit 32 and the RF transmitter 33 via the sequence controller 34.

For instance, the imaging-condition setting function 401 sets information about the gradient magnetic field, such as an application direction, magnitude, pulse length, and a generation timing of each gradient pulse, to the gradient waveform generator 341 in the sequence controller 34.

The gradient waveform generator 341 generates waveforms of respective gradient pulses in the X-axis direction, the Y-axis direction, and the Z-axis direction according to the information on the gradient magnetic field having been set as described above. The gradient waveform generator 341 transmits the generated gradient magnetic field waveforms to the gradient magnetic field power supplies 31x, 31y, 31z. Then, the gradient magnetic field power supplies 31x, 31y, 31z generate gradient currents corresponding to the respective gradient magnetic field waveforms, and apply the gradient currents to the respective coils for the X-axis, the Y-axis, and the Z-axis directions of the gradient coil 11.

Meanwhile, the waveform data on the gradient magnetic field waveform generated by the gradient waveform generator 341 are also sent to the magnetic-field-variation estimation function 402. The magnetic-field-variation estimation function 402 estimates the time variation of the eddy current magnetic field due to the eddy current by using the waveform data on the gradient magnetic field waveform.

The frequency-variation estimation function 403 estimates the frequency variation or the phase variation of the MR signal during the sampling period of the MR signal by using the time variation of the eddy current magnetic field, which is estimated by the magnetic-field-variation estimation function 402.

The frequency-correction-amount setting function 405 sets the frequency variation or the phase variation of the MR signal estimated by the frequency-variation estimation function 403 to the DDS 322 via the sequence controller 34 as the frequency correction amount or the phase correction amount. The frequency correction amount or the phase correction amount is set in real time to the DDS 322 during the execution period of each pulse sequence.

The MR signal received by the RF coil(s) 20 (or the WB coil 12) is inputted to the receiving circuit 32. The receiving circuit 32 illustrated in FIG. 2 is configured as a receiver according to a so-called direct sampling method. In the direct sampling method, the MR signal received by the RF coil(s) 20 (or the WB coil 12), with a carrier frequency, is directly sampled by the A/D converter 321 without converting its frequency, and is directly converted from an analog signal to a digital signal. Further, in the direct sampling method, the MR signal converted into the digital signal is detected by using a reference signal having a carrier frequency component outputted from the DDS 322, and is further converted into a baseband digital MR signal. The baseband digital MR signal is, a complex signal having, e.g., an I (in-phase) signal and a Q (quadrature) signal, and the baseband digital MR signal is sometimes referred to as raw data or k-space data as described above.

The center frequency (i.e., the magnetic resonance frequency or the Larmor frequency) of the MR signal received by the RF coil(s) 20 (or the WB coil 12) is subjected to time variation under the influence of the eddy current magnetic field. Meanwhile, the MRI apparatus 1 of the first embodiment is configured such that the frequency of the reference signal outputted from the DDS 322 changes so as to follow the variation of the eddy current magnetic field. As a result, at the output of the detector 323, the frequency variation due to the variation of the eddy current magnetic field is canceled, and the influence of the eddy current magnetic field can be suppressed.

In the MRI apparatus 1 of the first embodiment, the correction function 404 is constituted by the frequency-correction-amount setting function 405 of the processing circuitry 40 and the receiving circuit 32 that is hardware. The correction function 404 continuously corrects variation in frequency or phase of the MR signal caused by the eddy current magnetic field with the use of the estimated frequency or phase during the sampling period of the MR signal.

The corrected MR signal is inputted from the receiving circuit 32 to the processing circuitry 40 of the console 400 via the sequence controller 34. Thereafter, the reconstruction function 406 of the processing circuitry 40 reconstructs the corrected MR signal to generate an image in which the influence of the eddy current is suppressed.

Although the receiving circuit 32 using the direct sampling method is exemplified in the block diagram shown in FIG. 2, the receiving circuit 32 of the first embodiment is not limited to a receiver using the direct sampling method. For instance, as in the conventional heterodyne method, the MRI apparatus 1 may perform frequency conversion, in which the high-frequency MR signal outputted from the RF coil(s) 20 is converted into the signal of an intermediate frequency or baseband by using a local signal outputted from a local oscillator, and then is converted to the digital signal by the A/D conversion. When the receiving circuit 32 of the first embodiment is a heterodyne type, the frequency of the local oscillator may be varied so as to follow the variation of the eddy current magnetic field.

Figure 3:
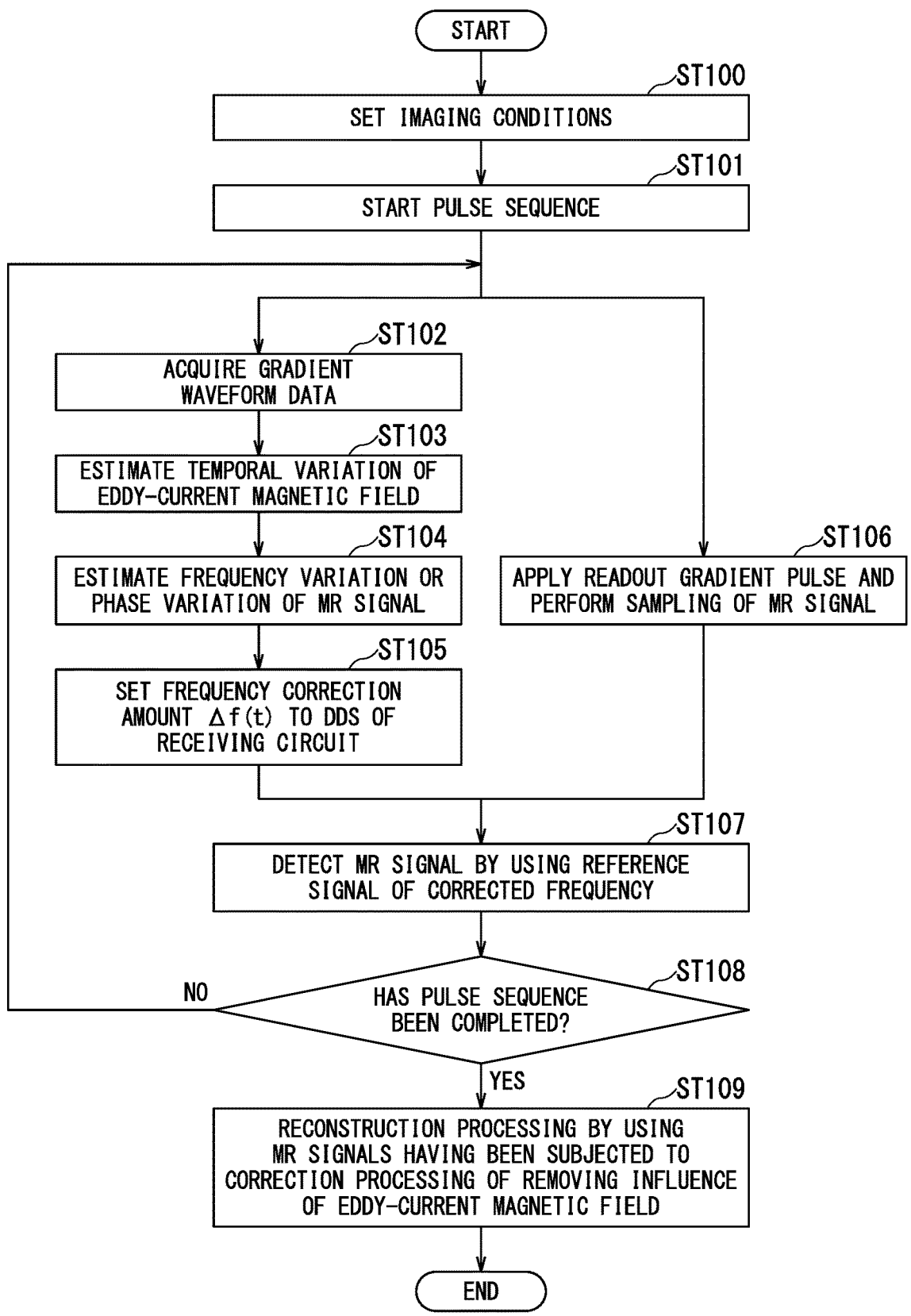
FIG. 3 is a flowchart illustrating processing performed by the MRI apparatus according to the first embodiment.

FIG. 3 is a flowchart illustrating processing performed by the MRI apparatus 1 according to the first embodiment configured as described above. Hereinafter, the operation of the MRI apparatus 1 according to the first embodiment will be described in detail with reference to this flowchart.

First, in the step ST100, the imaging-condition setting function 401 sets various parameters of the pulse sequence and imaging conditions such as the center frequency to the sequence controller 34.

FIGS. 4A to 4E are timing charts illustrating a pulse sequence to be set by the imaging-condition setting function 401. FIGS. 4A to 4E illustrate a pulse sequence of a standard spin echo method. FIG. 4A shows RF pulses including excitation pulses and refocusing pulses, FIG. 4B shows slice selection gradient pulses Gss, FIG. 4C shows phase encode gradient pulses Gpe, FIG. 4D shows readout gradient pulses Gro, and FIG. 4E shows MR signal received by the RF coil 20 as a high frequency signal.

There is no limitation on the type of pulse sequence applicable to MRI apparatus 1 of the present embodiment, and an arbitrary pulse sequence can be used for MRI apparatus 1 of the present embodiment.

Returning to FIG. 3, in the next step ST101, by a user's operation, the start of the pulse sequence having been set in the step ST100 is instructed.

In the next step ST102, the processing circuitry 40 (e.g., the magnetic-field-variation estimation function 402) acquires the waveform data of each gradient current that is to be applied to the gradient coil 11 on the basis of the pulse sequence having been set.

In the next step ST103, the processing circuitry 40 (e.g., the frequency-variation estimation function 403) calculates or estimates the time variation of the eddy current magnetic field from the acquired waveforms of the respective gradient currents (or waveforms of gradient pulses).

FIGS. 5A to 5G are timing charts illustrating the processing concept of the step ST103. FIG. 5A, FIG. 5C, and FIG. 5E schematically illustrate a part of the slice selection gradient pulse Gss, a part of the phase encode gradient pulse Gpe, and a part of the readout gradient pulse Gro of the pulse sequence shown in FIG. 4, respectively.

The shape of each gradient pulse is actually approximated as a trapezoidal shape rather than a rectangular shape, and an eddy current magnetic field occurs so as to cancel the variation of the magnetic field at the rising edge and falling edge of the trapezoidal shape of the gradient pulse. As described above, the eddy current magnetic field includes the zero-order component, which is independent from the spatial position, and the first-or-higher order component, which varies as a linear function of the spatial position or varies as a second or higher order function of the spatial position.

FIG. 5B is a diagram schematically illustrating the waveform of the zero-order component of the eddy current magnetic field (hereinafter, shortly referred to as the zero-order eddy magnetic field) $\Delta Bss$ that is generated corresponding to the slice selection gradient pulse Gss. Similarly, FIG. 5D is a diagram schematically illustrating the waveform of the zero-order eddy magnetic field $\Delta Bpe$ that is generated corresponding to the phase encode gradient pulse Gpe, FIG. 5F is a diagram schematically illustrating the waveform of the zero-order eddy magnetic field $\Delta Bro$ that is generated corresponding to the readout gradient pulse Gro.

Due to the rise of each gradient pulse, i.e., due to the variation of the gradient magnetic field in the positive direction, the zero-order eddy magnetic field of negative polarity is generated so as to cancel this variation, and this zero-order eddy magnetic field decays with a function approximated by an exponential function. On the other hand, due to the falling of each gradient pulse, i.e., due to variation of the gradient magnetic field in the negative direction, the zero-order eddy magnetic field of positive polarity is generated so as to cancel this variation, and this zero-order eddy magnetic field also decays with a function approximated by an exponential function.

The time constant of the exponential function may become a large value, e.g., from several msec to about 2000 msec. Thus, as exemplified in FIG. 5B, FIG. 5D, and FIG. 5F, the plural zero-order eddy magnetic fields generated at the respective rising and falling edges of the gradient pulses continue while decaying even after the application of the respective gradient pulses is stopped.

The time constant of the zero-order eddy magnetic field can be obtained in advance from, e.g., actual measurement data. The magnitude of the zero-order eddy magnetic field also can be estimated in advance from the magnitude of the variation in the rising edge and falling edge of each gradient pulse.

Thus, from the waveform data of the gradient pulse acquired in the step ST102, it is possible to estimate plural zero-order eddy magnetic fields that are generated corresponding to the rising and falling of each gradient pulse as shown in FIG. 5B, FIG. 5D, and FIG. 5F, as functions of time. By integrating (i.e., summing up) all the zero-order eddy magnetic fields, as shown in FIG. 5G, it is possible to estimate the integrated value of the zero-order eddy magnetic field $\Delta B(t)$ that sequentially varies as a function of time.

Since the waveform of the zero-order eddy magnetic field is approximated as an exponential function, once generated zero-order eddy magnetic field does not become completely zero even after a long period of time. Thus, when the integrated value of the zero-order eddy magnetic field $\Delta B(t)$ is calculated, plural zero-order eddy magnetic fields caused by gradient pulses applied during the limited past T seconds from the calculation target time t0 are used for the integration or the summation.

By executing the above-described calculation, it is possible to sequentially estimate the time variation of the zero-order eddy magnetic field $\Delta B(t)$, which varies during the application of the readout gradient pulse Gro, i.e., during the sampling period of the MR signal, from the gradient pulse waveform data on a real-time basis.

Returning to FIG. 3, in the next step ST104, the frequency-variation estimation function 403 in FIG. 2 estimates the frequency variation $\Delta f(t)$ (or phase variation Δφ(t)) of each MR signal from the time variation of the zero-order eddy magnetic field ΔB(t) estimated in the step ST103.

In the next step ST105, the frequency-correction-amount setting function 405 in FIG. 2 sets the estimated frequency variation Δf(t) as the frequency correction amount Δf(t) for the DDS 322 of the receiving circuit 32. Additionally or alternatively, the frequency-correction-amount setting function 405 sets the estimated phase variation Δφ(t) as the phase correction amount Δφ(t) for the DDS 322 of the receiving circuit 32.

FIGS. 6A to 6E are schematic timing charts for illustrating the processing concept of the steps ST104 and ST105. FIG. 6A shows the readout gradient pulse Gro, and FIG. 6B shows the MR signal emitted from the object. While the readout gradient pulse Gro is being applied, the MR signal is sampled and subjected to A/D conversion by the A/D converter 321.

FIG. 6C shows the zero-order component of the magnetic field applied to the object. The zero-order component B(t) of the magnetic field expressed by the following equation (1), i.e., the sum of the static magnetic field $B_0$ and the zero-order eddy magnetic field ΔB(t) is applied to the object.

$$B(t)=B_0+\Delta B(t) \qquad \text{Equation (1)}$$

The zero-order eddy magnetic field ΔB(t) shown in FIG. 6C is the same as that in FIG. 5G, which is estimated from the waveform of the gradient pulse.

FIG. 6D shows the magnetic resonance frequency f(t) estimated in the step ST104. The magnetic resonance frequency f(t) is calculated or estimated from the magnetic field B(t) of the equation (1) on the basis of the following equations (2) to (4).

$$f(t)=f_0+\Delta f(t) \qquad \text{Equation (2)}$$

$$f_0=\lambda \cdot B_0/(2\pi) \qquad \text{Equation (3)}$$

$$\Delta f(t)=\lambda \cdot \Delta B(t)/(2\pi) \qquad \text{Equation (4)}$$

In the equations (3) and (4), λ is a constant called a gyromagnetic ratio. The equation (2) indicates that the existence of the zero-order eddy magnetic field ΔB(t) causes the magnetic resonance frequency f(t) to vary by Δf(t) with respect to the magnetic resonance frequency $f_0$ determined only by the static magnetic field $B_0$.

FIG. 6E shows a waveform a reference signal outputted from the DDS 322 for detection of the MR signal. By setting the estimated frequency variation Δf(t) as the frequency correction amount Δf(t) for the DDS 322 of the receiving circuit 32, the output signal of the DDS 322 becomes such a signal that its frequency varies or fluctuates by Δf(t) with respect to the sinusoidal wave of the center frequency $f_0$.

Returning to FIG. 3 again, the processing of the step ST106 is performed in parallel with the processing of the steps ST102 to ST105. In the step ST106, the readout gradient pulse Gro is applied and the MR signal is sampled according to this application of the readout gradient pulse Gro.

In the next step ST107, the sampled MR signal is detected by using the reference signal, which is subjected to the frequency correction and then outputted from the DDS 322.

Figure 7:
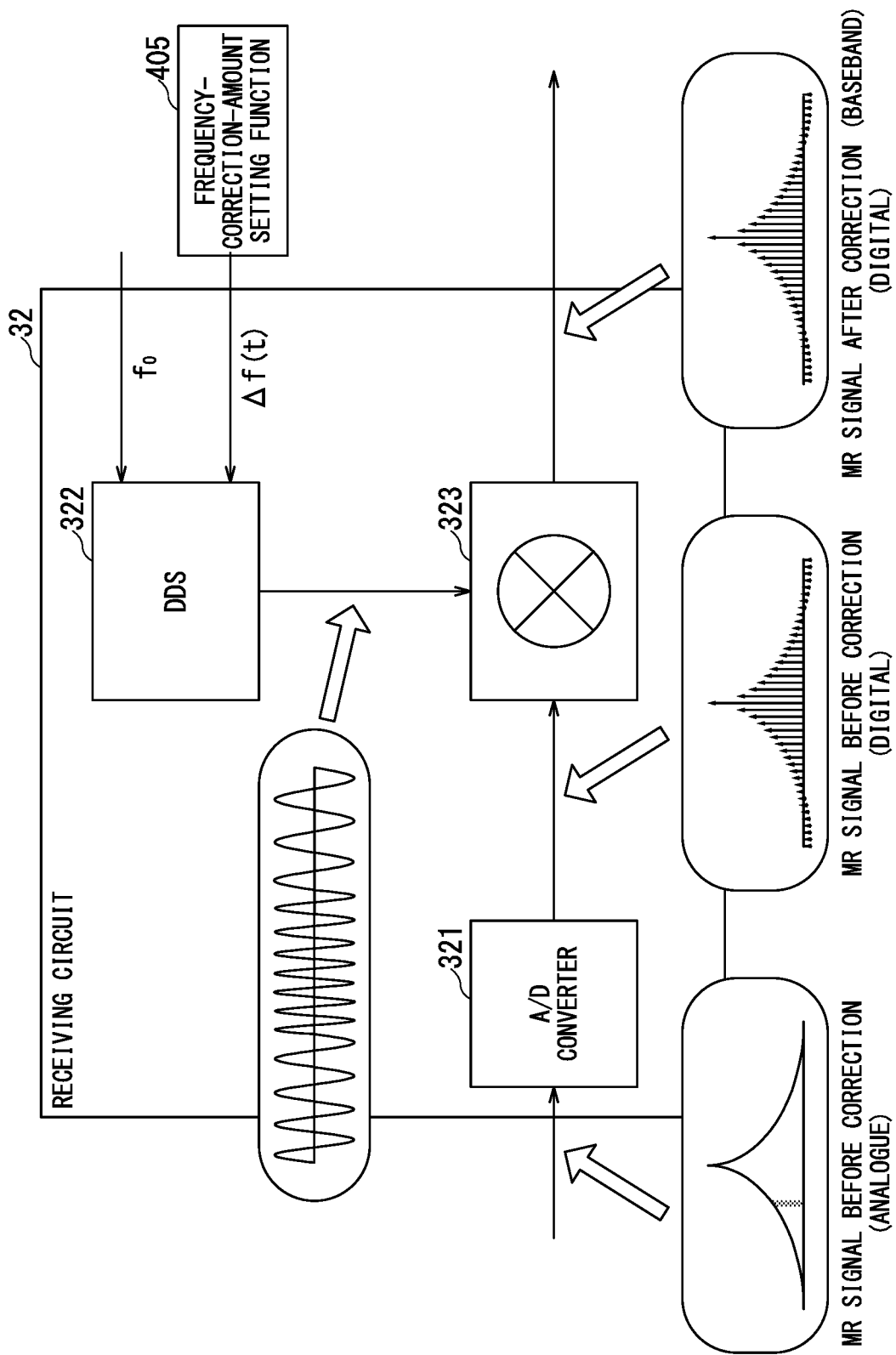
FIG. 7 is a schematic diagram illustrating a processing concept of detecting a sampled MR signal by using a reference signal that is subjected to frequency correction and outputted from the DDS.

FIG. 7 is a schematic diagram illustrating the processing concept of the steps ST105 to ST107. For the DDS 322, the center frequency $f_0$ corresponding to the static magnetic field $B_0$ and the frequency correction amount Δf(t) corresponding to the zero-order eddy magnetic field ΔB(t) are sequentially set. The DDS 322 changes the frequency in real time according to the frequency correction amount Δf(t), generates the detection reference signal having the frequency indicated by the equation (2), and outputs the detection reference signal to the detector 323.

The A/D converter 321 receives the uncorrected analog MR signal that has actually been subjected to the variation Δf(t) of the magnetic resonance frequency by the zero-order eddy magnetic field. The A/D converter 321 directly samples this MR signal, converts it into a digital signal, and outputs it to the detector 323 as the digital MR signal before correction.

By means of the detection with the use of the reference signal outputted from the DDS 322, the detector 323 cancels the frequency variation Δf(t) contained in the digital MR signal due to the zero-order eddy magnetic field. As a result, from the detector 323, the corrected MR signal, in which the influence of the zero-order eddy magnetic field is suppressed, is outputted as the baseband digital signal.

Returning to FIG. 3, in the next step ST108, it is determined whether the pulse sequence is completed or not. While the pulse sequence is continuing, the processing returns to the step ST102 and step ST106, and then the above-described processing is repeated.

When the pulse sequence is completed, reconstruction processing with the use of the corrected MR signal is performed in the next step ST109. As a result, it is possible to generate a high-quality image in which the influence of the eddy current magnetic field is suppressed.

According to the MRI apparatus 1 of the first embodiment described above, the influence of the frequency variation due to the eddy current magnetic field can be removed from all the sampling data of the MR signal, following the continuous time variation of the eddy current magnetic field.

For instance, by calculating the time variation ΔB(t) of the zero-order eddy magnetic field and/or the frequency variation Δf(t) at intervals equal to or smaller than the sampling interval Δτ of each MR signal in the A/D converter 321, all the sampling data of the MR signal can be finely corrected, following the time variation of the eddy current magnetic field.

Further, in the MRI apparatus 1 of the first embodiment, the correction of the frequency variation Δf(t) is performed in the receiving circuit 32 by using hardware constituted by components such as the DDS 322 and the detector 323. For this reason, the correction processing can be performed in real time.

Second Embodiment

Figure 8:
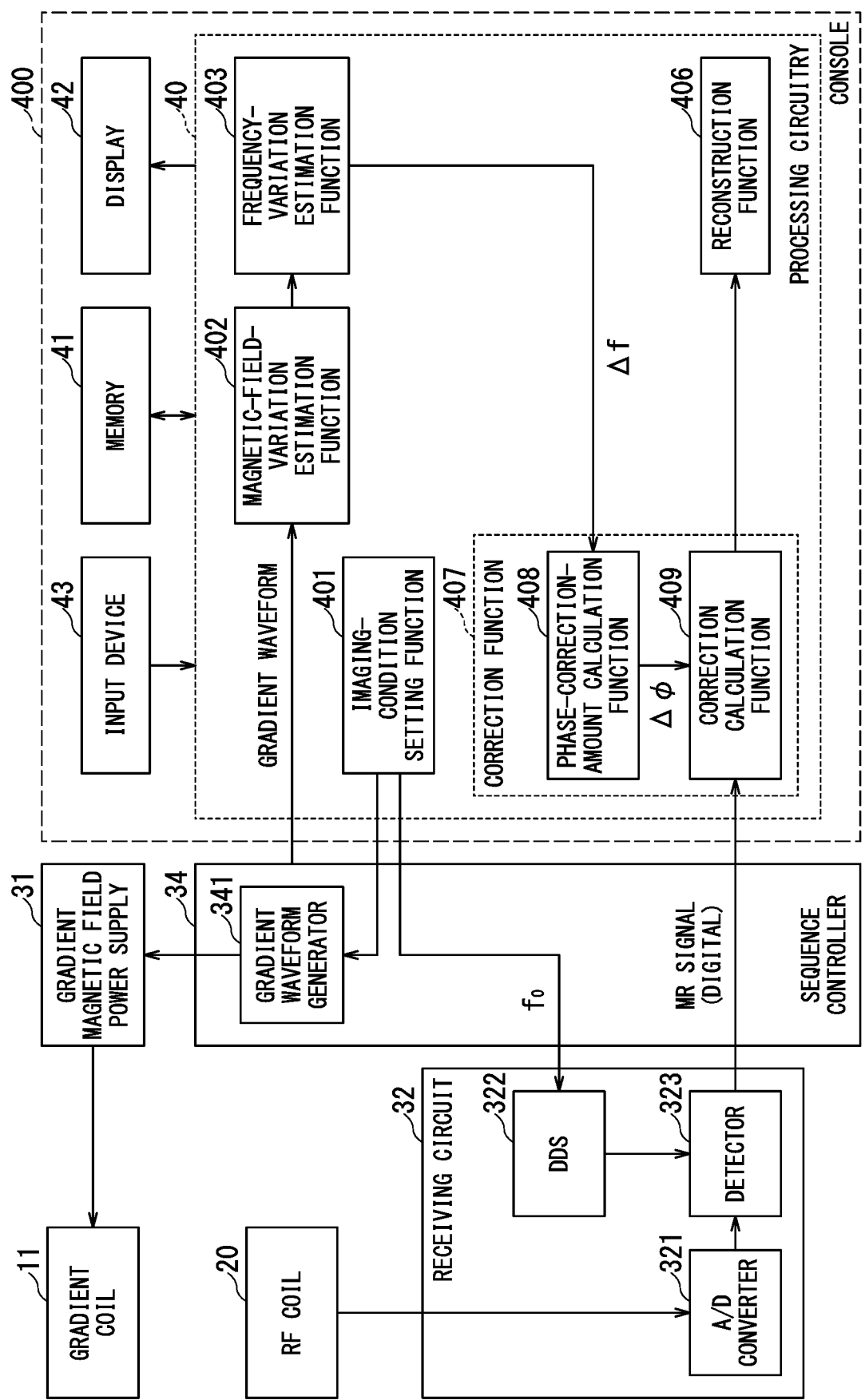
FIG. 8 is a functional block diagram of the MRI apparatus according to the second embodiment.

FIG. 8 is a block diagram illustrating the functional configuration of the MRI apparatus 1 according to the second embodiment. As described above, the MRI apparatus 1 according to the first embodiment suppresses the time variation of the zero-order component of the eddy current magnetic field by the hardware method, whereas the MRI apparatus 1 according to the second embodiment is configured to suppress the time variation of the zero-order component of the eddy current magnetic field by a software method.

The DDS 322 in the first embodiment (FIG. 2) outputs the reference signal of the frequency obtained by adding the frequency correction amount Δf(t) corresponding to the zero-order eddy magnetic field ΔB(t) to the center frequency $f_0$, while the DDS 322 in the second embodiment shown in FIG. 8 outputs the reference signal of the fixed center frequency $f_0$. As a result, in the second embodiment, the MR signal outputted from the receiving circuit 32 to the processing circuitry 40 of the console 400 becomes a signal before correction having the frequency variation Δf(t) caused by the zero-order eddy magnetic field.

Further, the difference in configuration shown in block diagrams (FIG. 2 and FIG. 8) between the first and second embodiments is that the MRI apparatus 1 of the second embodiment further includes the correction function 407 composed of a phase-correction-amount calculation function 408 and a correction calculation function 409 as shown in FIG. 8. The correction function 407 is realized as software processing by causing the processor included in the processing circuitry 40 to execute predetermined programs stored in the memory 41, similarly to the other functions of the processing circuitry 40.

Figure 9:
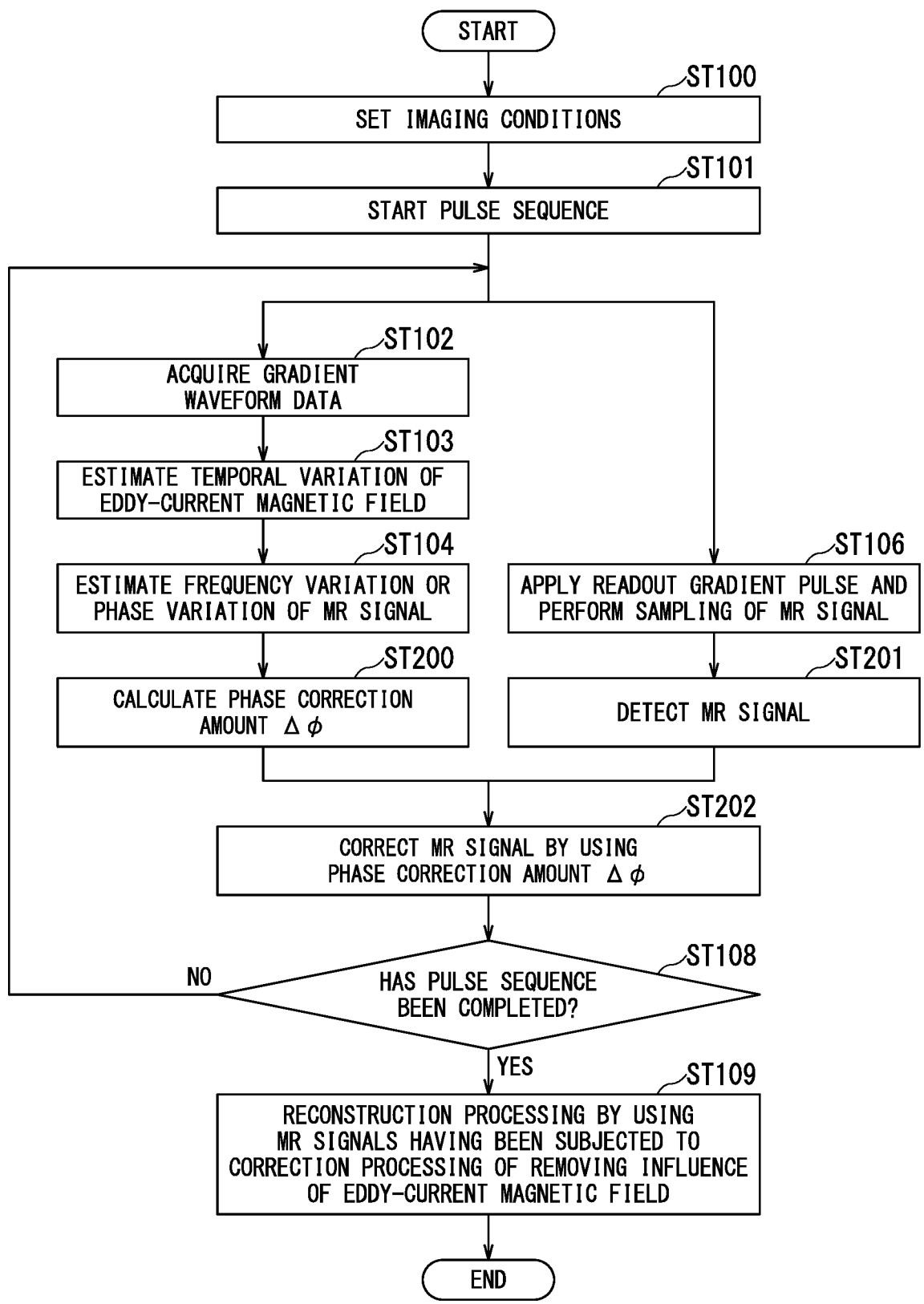
FIG. 9 is a flowchart illustrating processing performed by the MRI apparatus according to the second embodiment.

FIG. 9 is a flowchart illustrating processing performed by the MRI apparatus 1 according to the second embodiment. The same step number is assigned to the same processing as the flowchart (FIG. 3) of the first embodiment, and duplicate description is omitted.

In the step ST201 of FIG. 9, an MR signal is detected by the detector 323, and the MR signal as the baseband digital signal is generated. As described above, this MR signal is a MR signal before correction having the frequency variation Δf(t) caused by the zero-order eddy magnetic field.

In the step ST200, the frequency variation Δf(t) estimated in the step ST104 is time-integrated to calculate the phase variation Δφ(t). The phase correction amount is obtained by inverting the sign of the phase variation Δφ(t). In the next step ST202, the detected MR signal is corrected by using the phase correction amount.

FIGS. 10A to 10D are timing charts illustrating the processing concept of the above-described steps ST200, ST201, and ST202.

FIG. 10A schematically shows an MR signal as an analog signal. FIG. 10B is a diagram illustrating the MR signal(t) as the baseband digital signal to be generated in the processing of the step ST201. The MR signal before correction is denoted as S(t).

FIG. 10C shows the phase variation Δφ(t) calculated in the step ST200. The phase variation Δφ(t) is calculated by time-integrating the frequency variation Δf(t) (FIG. 6D) due to the zero-order eddy magnetic field calculated in the step ST104.

FIG. 10D is a schematic diagram illustrating the corrected digital MR signal generated by the processing of the step ST202. When the corrected MR signal is expressed as S'(t), the corrected MR signal is calculated by, e.g., the following equation (5).

$$S'(t) = S(t) \cdot \exp[-j\Delta\varphi(t)] \quad \text{Equation (5)}$$

Each of the MR signal (t) before correction and the MR signal S'(t) after correction is a complex signal.

After the correction processing in the step ST202, it is determined in the step ST108 whether the pulse sequence is completed or not. When the pulse sequence is completed, reconstruction processing using the corrected MR signal is performed in the next step ST109.

Since the MRI apparatus 1 of the second embodiment performs software-like processing, the correction processing in the step ST202 is not necessarily performed on a real-time basis during the execution period of the pulse sequence. The phase correction amount and the detected MR signal may be stored in the memory 41 so that the correction calculation in the step ST202 is performed after execution of the pulse sequence.

The MRI apparatus 1 of the second embodiment, as well as the first embodiment, can also remove the influence of the frequency variation due to the eddy current magnetic field from all the sampled data of the MR signal, resulting in that all the sampled data are corrected so as to follow the continuous time variation of the eddy current magnetic field.

In addition, by setting the calculation time interval of the time variation ΔB(t) of the zero-order eddy magnetic field, the frequency variation Δf(t), and the phase variation Δφ(t) to be equal to the sampling interval Δτ of the MR signal performed by the A/D converter 321, correction finely following the time variation of the eddy current magnetic field can be performed on all the sampling data of the MR signal.

Modification of Second Embodiment

In the MRI apparatus 1 of the second embodiment, the phase variation due to the zero-order eddy magnetic field is corrected by software operation. In order to shorten the time required for the correction calculation in this case, the correction by the software operation may be performed after removing the MR signal which are not necessarily required for image reconstruction, e.g., by filtering processing, instead of correcting all the acquired MR signal. The filtering in this case includes processing of removing unnecessary signal in a broad sense.

Figure 11:
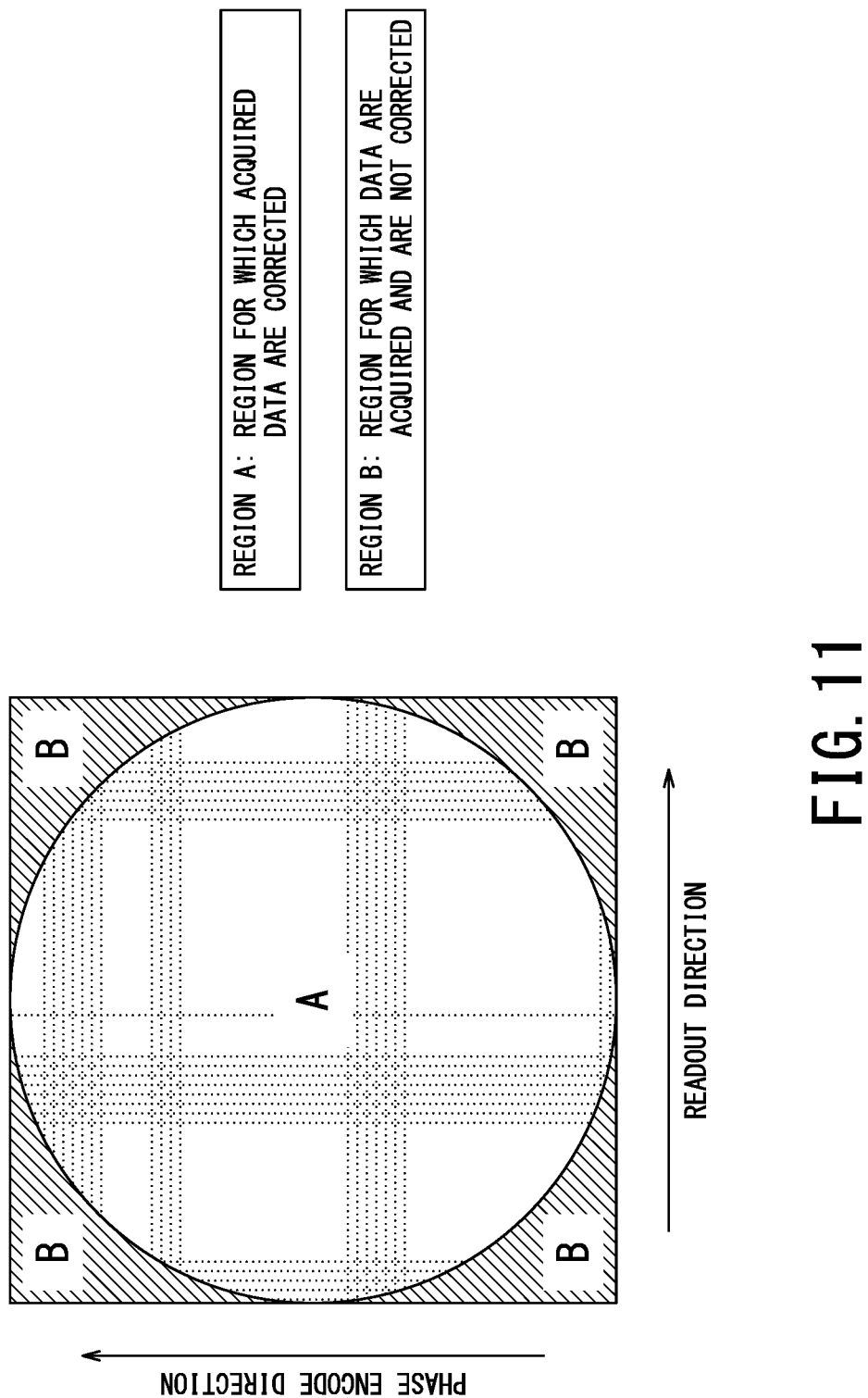
FIG. 11 is a schematic diagram illustrating filtering for shortening correction processing time.

FIG. 11 is a schematic diagram illustrating the above-described filtering. As shown in FIG. 11, the MR signal is filled in the two-dimensional k-space in the readout direction and in the phase encoding direction, and the following filtering method may be performed in this case. That is, the correction in the step ST202 is performed on the data in the central circular region ("A" region), while the data of the high-frequency region ("B" region) at the four corners of the two-dimensional k-space are replaced with a zero value, thus omitting the correction processing in the step ST202.

According to the MRI apparatus of each embodiment described above, degradation of image quality due to the eddy current magnetic field can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. An MRI apparatus comprising:
   a gradient coil configured to superimpose a gradient magnetic field on a static magnetic field;
   a receiving circuit configured to receive an MR (magnetic resonance) signal from an object placed in the gradient magnetic field; and
   processing circuitry configured to
      estimate time variation of an MR (magnetic resonance) frequency during a sampling period in which a readout gradient is applied for sampling the received MR signal based on waveform data of a gradient current applied to the gradient coil,
      perform correction on a frequency or phase of the received MR signal during the sampling period in which the readout gradient is applied, based on the estimated time variation of the MR frequency, and reconstruct an image by using the MR signal subjected to the correction, wherein, the receiving circuit is configured to digitize the MR signal and then output the digitized MR signal to the processing circuitry; and the processing circuitry is configured to generate k-space data by filling k-space with the digitized MR signal outputted from the receiving circuit, perform correction on a frequency or phase of the k-space data based on the estimated time variation of the MR frequency during the sampling period, and reconstruct an image by using the k-space data after correction.

2. The MRI apparatus according to claim 1, wherein the processing circuitry is configured to estimate the time variation of the MR frequency caused by time variation of an eddy current magnetic field due to an eddy current.

3. The MRI apparatus according to claim 2, wherein the processing circuitry is configured to sequentially estimate the eddy current magnetic field at a certain timing during the sampling period, by using waveform data of a plurality of gradient currents that are applied during a predetermined period prior to the certain timing.

4. The MRI apparatus according to claim 2, wherein the processing circuitry is configured to estimate variation in frequency or phase of the MR signal during a sampling period of the MR signal by using time variation of an estimated zero-order component of the eddy current magnetic field.

5. The MRI apparatus according to claim 1, wherein the processing circuitry is configured to sequentially estimate variation in frequency or phase of the MR signal, at a same interval as a sampling interval of the MR signal or at an interval shorter than the sampling interval, and sequentially correct the variation in frequency or phase of the MR signal in the sampling period, at a same interval as the sampling interval or at an interval shorter than the sampling interval.

6. The MRI apparatus according to claim 1, wherein the processing circuitry is configured to perform the correction on the frequency or phase of the MR signal by applying phase rotation to the k-space data of the MR signal, in such a manner that the phase rotation cancels a frequency or phase corresponding to the estimated time variation of the MR frequency.

7. The MRI apparatus according to claim 6, wherein the processing circuitry is configured to perform filtering for removing a signal unnecessary for image reconstruction out of the sampled MR signal, and then perform the correction on the frequency or phase of the MR signal.

8. An MRI apparatus comprising:

a gradient coil configured to superimpose a gradient magnetic field on a static magnetic field;

a receiving circuit configured to receive an MR (magnetic resonance) signal from an object placed in the gradient magnetic field; and processing circuitry configured to estimate time variation of an MR (magnetic resonance) frequency during a sampling period in which a readout gradient is applied for sampling the received MR signal based on waveform data of a gradient current applied to the gradient coil, perform correction on a frequency or phase of the received MR signal received by the receiving circuit during the sampling period in which the readout gradient is applied, based on the estimated time variation of the MR frequency during the sampling period, and reconstruct an image by using the MR signal subjected to the correction, wherein the receiving circuit includes a detector configured to detect the MR signal;

the processing circuitry is configured to control the receiving circuit in such a manner that a frequency or phase of the MR signal outputted from the detector is corrected according to the estimated time variation of the MR frequency during the sampling period, and reconstruct an image by using the MR signal after correction that are outputted from the detector;

the receiving circuit further includes a synthesizer configured to output a reference signal corresponding to the estimated time variation of the MR frequency, the reference signal being used in the detector for detecting the received MR signal, and the detector is configured to correct variation in frequency or phase of the MR signal by using the reference signal.

9. The MRI apparatus according to claim 8, wherein the processing circuitry is configured to set the reference signal to the receiving circuit in such a manner that a frequency or phase of the reference signal continuously varies, following the estimated variation in frequency or phase of the MR signal, at least during the sampling period.

* * * * *